United States Patent
Sandhu et al.

[11] Patent Number: 6,077,732
[45] Date of Patent: *Jun. 20, 2000

[54] METHOD OF FORMING A THIN FILM TRANSISTOR

[75] Inventors: Gurtej S. Sandhu; Shubneesh Batra; Pierre C. Fazan, all of Boise, Id.

[73] Assignee: Micron Technology, Inc., Boise, Id.

[*] Notice: This patent is subject to a terminal disclaimer.

[21] Appl. No.: 09/074,634

[22] Filed: May 7, 1998

Related U.S. Application Data

[63] Continuation of application No. 08/624,683, Mar. 25, 1996, Pat. No. 5,753,543.

[51] Int. Cl.[7] .................................................. H01L 21/84

[52] U.S. Cl. .......................................... 438/158; 438/163

[58] Field of Search .................................... 438/158, 163

[56] References Cited

U.S. PATENT DOCUMENTS

| | | | |
|---|---|---|---|
| 4,318,216 | 3/1982 | Hsu . | |
| 5,320,975 | 6/1994 | Cederbaum et al. | 437/44 |
| 5,334,861 | 8/1994 | Pfiester et al. | 257/67 |
| 5,348,897 | 9/1994 | Yen | 438/163 |
| 5,366,909 | 11/1994 | Song et al. | 438/163 |
| 5,373,170 | 12/1994 | Pfiester et al. | 257/69 |

(List continued on next page.)

FOREIGN PATENT DOCUMENTS

| | | |
|---|---|---|
| 1-158775A | 6/1989 | Japan . |
| 4-254335A | 9/1992 | Japan . |

OTHER PUBLICATIONS

Pollack, G.P. et al., "Hydrogen Passivation of Polysilicon MOSFET's From A Plasma Nitride Source", IEEE, 1984 pp. 408–410.

Kamins, T.I., "Hydrogenation of Transistors Fabricated in Polycrystalline–Silicon Films", IEEE, 1980, pp. 159–161.

Seager. C.H. et al., "Studies of the hydrogen passivation of silicon grain boundaries", J.Appl. Phys. 52, Feb. 1981, pp. 1050–1055.

Kitajima, H. et al., "Leakage Current Reduction in Sub–Micron Channel Poly–Si TFTs", Extended Abstract—1991 International Conference on Solid State Devices and Materials, Yokohama, 1991, pp. 174–176.

Sunada, Takeshi et al., "The Role of Fluorine Termination in the Chemical Stability of HF–Treated Si Surfaces", Dept. of Electrical Engineering, Hiroshima University, Higashi–Hiroshima 724, Accepted for Publication 1990.

*Primary Examiner*—Richard Booth
*Attorney, Agent, or Firm*—Wells, St. John, Roberts, Gregory & Matkin P.S.

[57] ABSTRACT

A method of forming a bottom gated TFT includes, a) providing a transistor gate relative to a substrate which projects outward thereof; b) providing a dielectric layer over the gate; c) providing a TFT layer of semiconductive material over the dielectric layer; the thin film transistor layer comprising a source area, a channel area, a drain area, and a drain offset area; d) providing a masking layer over the TFT layer; e) anisotropically etching the masking layer to define a masking sidewall spacer laterally adjacent the transistor gate over the drain offset area and leave the channel area outwardly exposed; f) with the masking sidewall spacer in place, implanting a conductivity enhancing impurity of a first type into the thin film channel area to provide a thin film channel region; and g) masking the channel area and the drain offset area while implanting conductivity enhancing impurity of a second type into the thin film source and drain areas to define thin film source and channel regions. Also contemplated is providing a fluorine containing layer over the polycrystalline thin film layer and over the sidewall spacer prior to the channel masking step, followed by annealing thereof at a temperature and for a time which in combination are effective to drive fluorine into the polycrystalline thin film layer and incorporate fluorine within grain boundaries in the polycrystalline thin film to passivate said grain boundaries. Top gated transistors are also contemplated, where the spacer is formed over a substrate elevation step.

6 Claims, 4 Drawing Sheets

U.S. PATENT DOCUMENTS

| | | | |
|---|---|---|---|
| 5,403,761 | 4/1995 | Rha . | |
| 5,411,909 | 5/1995 | Manning et al. | 437/52 |
| 5,418,393 | 5/1995 | Hayden | 257/347 |
| 5,432,102 | 7/1995 | Cho et al. | 438/163 |
| 5,459,088 | 10/1995 | Rha et al. | 438/158 |
| 5,510,278 | 4/1996 | Nguyen et al. | 438/158 |
| 5,665,611 | 9/1997 | Sandhu et al. . | |
| 5,670,399 | 9/1997 | Manning et al. . | |
| 5,716,879 | 2/1998 | Choi et al. . | |
| 5,728,604 | 3/1998 | Rha et al. . | |
| 5,753,543 | 5/1998 | Sandhu et al. | 438/163 |
| 5,759,879 | 6/1998 | Iwasaki | 438/166 |
| 5,766,988 | 6/1998 | Cho et al. | 438/163 |
| 5,869,360 | 2/1999 | Batra et al. | 438/151 |

METHOD OF FORMING A THIN FILM TRANSISTOR

RELATED PATENT DATA

This application is a continuation application of Ser. No. 08/624,683, which was filed on Mar. 25, 1996 now U.S. Pat. No. 5,753,543.

TECHNICAL FIELD

This invention relates to methods of forming thin film transistors.

BACKGROUND OF THE INVENTION

As circuit density continues to increase, there is a corresponding drive to produce smaller and smaller field effect transistors. Field effect transistors have typically been formed by providing active areas within a bulk substrate material or within a complementary conductivity type well formed within a bulk substrate. Although the field effect transistor feature size is reducing with advances in process technology, even greater packing density can be achieved by forming transistors over insulating layers, such as oxide. These transistors are commonly referred to as "thin film transistors" (TFT).

With TFTs, a thin film of semiconductive material is first provided. A central channel region of the thin film is masked, while opposing adjacent source/drain regions are doped with an appropriate p or n type conductivity enhancing impurity. A gate insulator and gate are provided either above or below the thin film channel region, thus providing a field effect transistor having an active channel region formed entirely within a thin film as opposed to a bulk semiconductor substrate.

The invention grew out of needs associated with TFTs and their usage in high-density static random access memories (SRAMs) and flat panel displays. A static memory cell is characterized by operation in one of two mutually exclusive and cell-maintaining operating states. Each operating state defines one of the two possible binary bit values, 0 or 1. A static memory cell typically has an output which reflects the operating state of the memory cell. Such an output produces a "high" voltage to indicate a "set" operating state. The memory cell output produces a "low" voltage to indicate a "reset" memory cell operating state. A low or reset output voltage usually represents a binary value of 0, and a high or set output voltage represents a binary value of 1.

A static memory cell is said to be bi-stable because it has two stable or self-maintaining operating states, corresponding to two different output voltages. Without external stimuli, a static memory cell will operate continuously in a single one of its two operating states. It has internal feedback to maintain a stable output voltage, corresponding to operating states of the memory cell, as long as the memory cell receives power.

The operation of the static memory cell is in contrast to other types of memory cells, such as dynamic cells, which do not have stable operating states. A dynamic memory cell can be programmed to store a voltage which represents one of two binary values, but requires periodic reprogramming or "refreshing" to maintain this voltage for more than very short time periods. A dynamic memory cell has no feedback to maintain a stable output voltage. Without refreshing, the output of a dynamic memory cell will drift towards intermediate or indeterminate voltages, effectively resulting in loss of data.

Dynamic memory cells are used in spite of this limitation because of the significantly greater packaging densities which can be attained. For instance, a dynamic memory cell can be fabricated with a single MOSFET transistor, rather than the six transistors typically required in a static memory cell. SRAM cell density can be maximized with three-dimensional integration. For example, load transistors of the SRAM cell constitute TFTs which are folded over the bulk transistors. Because of the significantly different architectural arrangements and functional requirements of static and dynamic memory cells and circuits, static memory design has developed along a different path than has the design of dynamic memories.

Ongoing efforts in SRAM circuitry have brought about the development of TFTs in an attempt to minimize space and for other advantageous reasons associated with TFTs. While the invention grew out of needs associated with TFTs of SRAM circuitry, the artisan will appreciate applicability of the invention to other types of circuitry, for example, TFT based AMLCDs where a TFT can be used as a pass transistor in a pixel and also in the driver circuitry.

One common material utilized as the thin source, channel and drain film in a TFT is polysilicon. Such is comprised of multiple forms of individual single crystal silicon grains. The locations where two individual crystalline grains abut one another is commonly referred to as a grain boundary. Grain boundaries are inherent in polycrystalline materials, such as polysilicon, as it is the boundaries which define the breaks between individual crystal grains. The crystalline structure breaks down at the grain boundaries, giving rise to a high concentration of broken or "dangling" Si bonds. These dangling bonds "trap" carriers and give rise to potential barriers at the grain boundaries. These potential a barriers impede the flow of carriers in polysilicon, thus reducing conductivity compared to bulk silicon.

The grain boundary potential barrier height is proportional to the square of the dangling bond density, or "trap density". The smaller the grain size, the higher the trap density and thus the lower the conductance. In a TFT, the grain boundary potential barrier height in the channel is controlled by the gate voltage, and hence the conductivity is a function of the gate voltage. The TFTs, however, have a lower drive compared to bulk transistors because of lower mobility in the channel and higher $V_t$ due to the larger trap concentration.

The grain boundary trap concentration also affects the leakage current or the OFF current in TFTs. In polysilicon or other polycrystalline TFTs, the presence of grain boundary traps at the drain end can dramatically increase the leakage current and the presence of a "gate-to-drain" electric field. The increase in leakage results from either "thermionic field emission" and/or "Poole-Frenkel" emission through the grain boundary traps. Accordingly, the greater the number of grain boundaries (i.e., the smaller the grain size), the greater the current leakage through the material. Greater current leakage means that more power is required to replace the leaking current to maintain an SRAM cell transistor in its desired powered-on state. Such leakage is particularly adverse in laptop computers, where desired power consumption when a cell's state is not being changed would be desired to be very low to extend battery life.

High density SRAMs (16 Mb or higher) typically require TFTs with low OFF currents (<50 fA) and high ON current (>5 nA) in order to obtain acceptable low standby leakage and high memory cell stability. Current state-of-the-art TFTs provide low standby current at the expense of ON current, or at the expense of additional process complexity. One present way of minimizing this current leakage at the cost of increased process complexity is by providing a "lightly doped offset" (LDO) region within the thin film. A lightly doped offset region is an elongated region within the thin film which is positioned effectively between the channel region and the drain region and is not under direct gate control but is affected by the sole fringing fields. Such a region provides a buffer zone for the electric field between the channel and drain which minimizes leakage therebetween.

One prior art manner of contending with problems associated with grains boundaries is to "passivate" such boundaries after their formation. One technique involves exposing the thin film polycrystalline layer to atomic or plasma hydrogen, with the intent being to produce silicon-hydrogen bonds instead of dangling bonds at the boundary interfaces. An alternate technique is to implant F into the thin film polycrystalline layer in an effort to produce silicon-fluorine bonds at the boundary interfaces. A silicon-fluorine bond is much more desirable than a silicon hydrogen bond due to increased high temperature stability. However, the ion implantation technique of providing fluorine into a polycrystalline thin film is not without drawbacks. For example, the implantation undesirably damages the thin film layer and typically creates more dangling bonds inherent from the implantation process. It also is not particularly effective in putting the F at the grain boundaries where it is required.

Relatedly, literature reports have shown that it is possible to enhance the performance of thin film transistors, and particularly polysilicon thin film transistors, by using a drain offset region between the channel region and the drain region. The prior art literature reports provision of such layer to have a doping concentration identical to that of the channel region, or more preferably to have a dopant concentration of opposite conductivity type to that of the channel region and at a concentration less than that of the heavily conductively doped source and drain regions.

Figure 1:
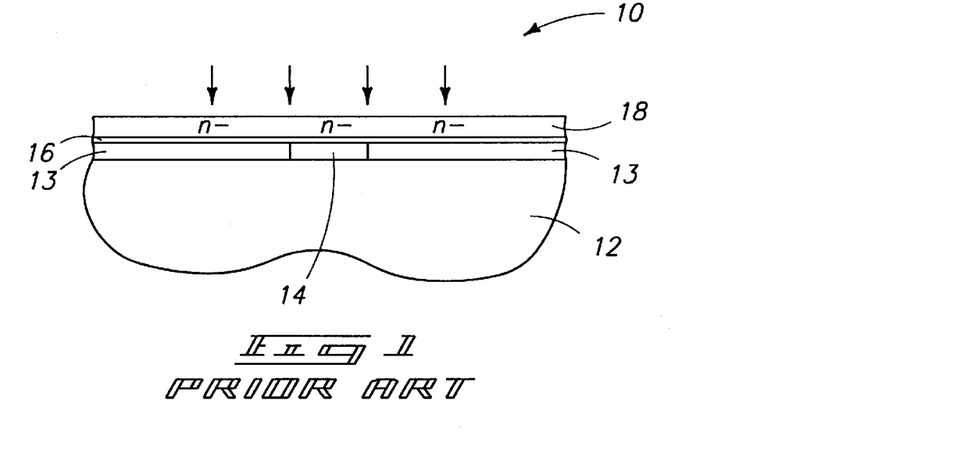
FIG. 1 is a diagrammatic sectional view of one prior art wafer fragment and discussed in the "Background" section above.

Prior art processes of producing thin film transistors with drain offset regions are described with reference to FIGS. 1–6. For example, FIG. 1 illustrates a semiconductor wafer fragment 10 comprised of a substrate 12. An insulating layer 13 is provided thereover, and includes an intervening or embedded electrically conductive transistor gate 14. That portion of substrate 12 immediately beneath layer 13 and gate 14 would comprise an insulator material. A gate dielectric layer 16 overlies insulating layer 13 and gate 14. Further, a thin film transistor layer 18 is provided over gate dielectric layer 16.

In accordance with prior art methods, thin film transistor layer 18 ii is subjected to a blanket implant, in this described example an n-type material, to some suitable first low concentration, such as $5 \times 10^{17}$ ions/cm$^3$–$5 \times 10^{18}$ ions/cm$^3$. The function of the blanket implant is to provide desired resultant semiconductivity for the channel region of the transistor.

Figure 2:
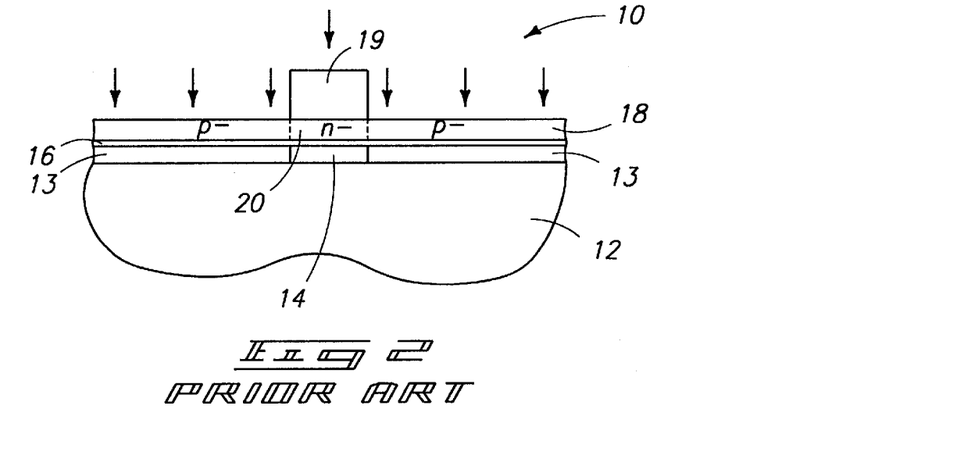
FIG. 2 is a view of the prior art FIG. 1 wafer at a prior art processing step subsequent to that shown by FIG. 1.

Referring to FIG. 2, a mask 19 is provided over thin film transistor layer 18 to define a desired n– channel region 20 overlying gate 14. Wafer 10 is then subjected to p-type doping to provide an example p– implant concentration outside of mask 19 to provide an example p– concentration of from $5 \times 10^{18}$ ions/cm$^3$ $5 \times 10^{19}$ ions/cm$^3$. The purpose of such implant is to overwhelm the concentration of the blanket n– implant previously provided to produce a desired drain offset region.

Figure 3:
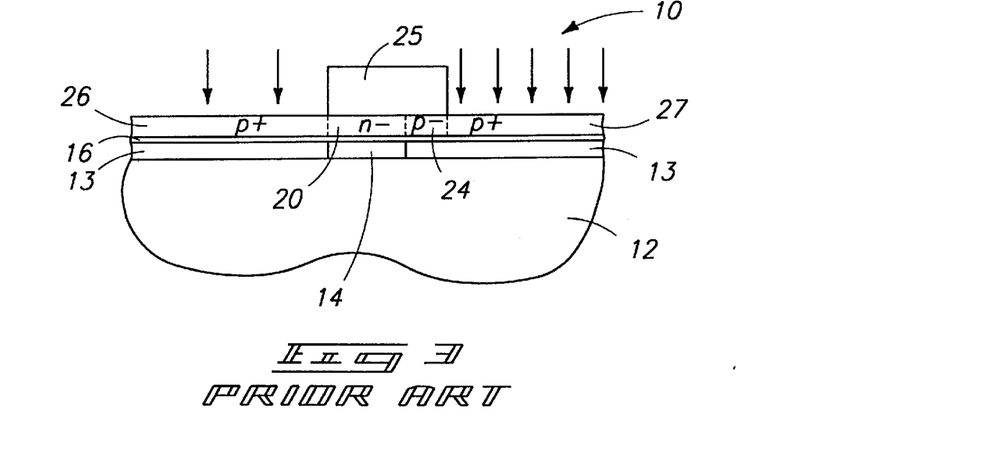
FIG. 3 is a view of the prior art FIG. 1 wafer at a prior art processing step subsequent to that shown by FIG. 2.

Referring to FIG. 3, channel region 20 and what becomes a desired drain offset region 24 are masked with a photoresist masking block 25. Wafer fragment 10 is then subjected to heavy p-type doping to provide a resultant p+ concentration of for example greater than or equal to $1 \times 10^{20}$ ions/cm$^3$. The result is provision of desired source and drain regions 26 and 27, respectively. The effect is to produce a lighter doped drain offset region of the same conductivity type of the source and drain regions.

Figure 4:
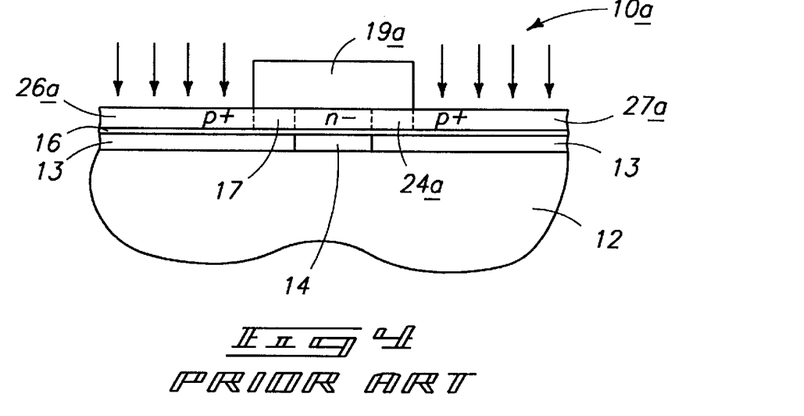
FIG. 4 is a diagrammatic sectional view of another prior art wafer fragment ad is discussed in the "Background" section above.

An alternate prior art method of producing thin film transistors having drain offsets is described with reference to FIG. 4. Like numerals from the first described embodiment are utilized where appropriate, with differences being indicated by the suffix "a", or with different numerals. FIG. 4 in this described embodiment depicts a processing step immediately subsequent to the FIG. 1 processing step of the first described embodiment. Here, a masking block 19a is patterned to overlap or extend laterally beyond the confines of gate 14 to provide a source offset region 17 and a drain offset region 24a. The wafer is then subjected to heavy p+ doping to produce the illustrated source and drain regions 26a and 27a, respectively. Therefore in accordance with this described prior art embodiment, the resultant drain offset region 24a is provided to be of the same identical concentration and conductivity type as that of channel region 22.

Figure 5:
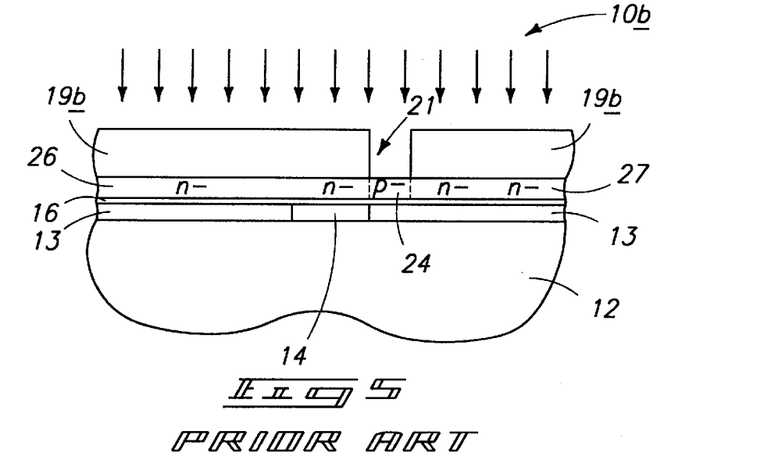
FIG. 5 is a diagrammatic sectional view of yet another prior art wafer fragment and is discussed in the "Background" section above.
Figure 6:
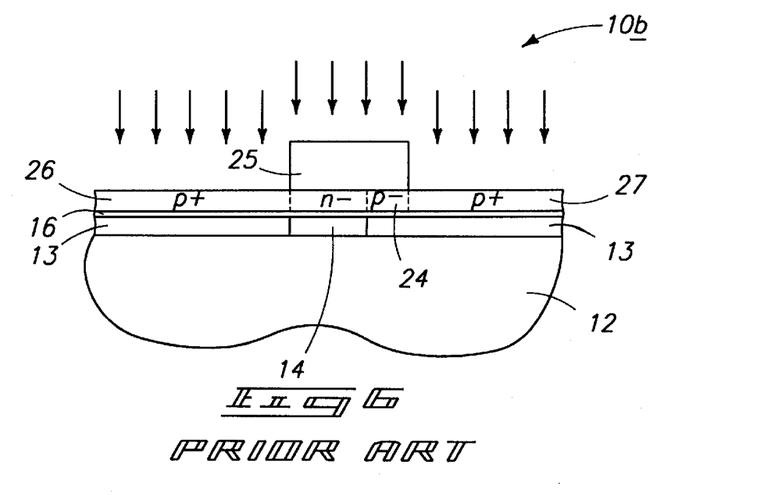
FIG. 6 is a view of the prior art FIG. 5 wafer at a prior art processing step subsequent to that shown by FIG. 5.

Yet another alternate prior art embodiment and method are shown in FIGS. 5 and 6. Like numerals from the first described embodiment are utilized where appropriate, with differences being indicated by the suffix "b" or with different numerals. FIG. 5 illustrates a wafer fragment 10b shown at a processing step immediately subsequent to that depicted by FIG. 1 of the first described embodiment. Here, a photoresist masking layer 19b is patterned to provide a contact opening 21 effective for producing a desired drain offset region 24. The wafer fragment is then subjected to light p-type doping, yet to a concentration sufficient to overwhelm the n– concentration previously provided in drain offset region 24 by the FIG. 1 blanket implant.

Referring to FIG. 6, masking block 25 is provided and the wafer subjected to p+ doping to effectively produce the same resultant prior art construction of FIG. 3.

This invention concerns improved methods of forming thin film transistors having drain offsets as well as to an improved thin film transistor construction.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a bottom gated thin film transistor comprises the following steps:

providing a transistor gate relative to a substrate, the gate projecting outward relative to the substrate;

providing a gate dielectric layer over the transistor gate;

providing a thin film transistor layer of semiconductive material over the gate dielectric layer; the thin film transistor layer comprising a source area, a channel area, a drain area, and a drain offset area;

providing a masking layer over the thin film transistor layer;

anisotropically etching the masking layer to define a masking sidewall spacer laterally adjacent the transistor gate over the drain offset area and leave the channel area outwardly exposed;

with the masking sidewall spacer in place, implanting a conductivity enhancing impurity of a first type into the thin film channel area to provide a thin film channel region; and masking the channel area and the drain offset area while implanting conductivity enhancing impurity of a second type into the thin film source and drain areas to define thin film source and channel regions.

Figure 7:
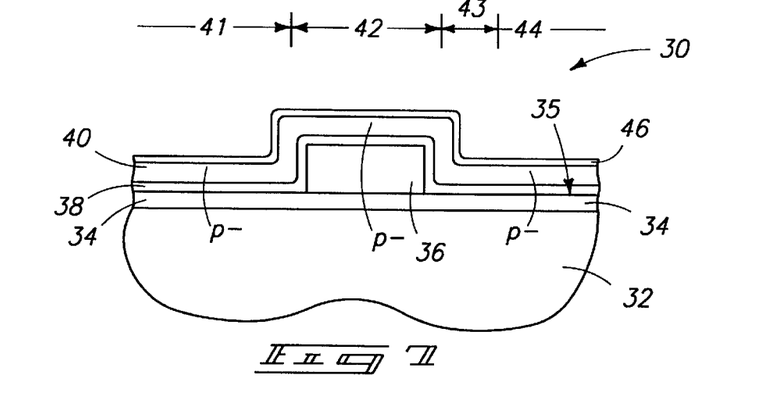
FIG. 7 is a diagrammatic sectional view of a wafer fragment at one processing step in accordance with the invention.

Referring to FIG. 7, a semiconductor wafer fragment in process in a method of forming a bottom gated thin film transistor in accordance with the invention is indicated generally with reference numeral 30. Such comprises a bulk semiconductor substrate 32 having an overlying insulator layer 34, such as $SiO_2$. Collectively, such define an outer substrate surface 35. A gate 36 is provided relative to substrate 32/34, and projects outwardly relative to outer surface 35. A gate dielectric layer 38 is provided outwardly relative to surface 35 and transistor gate 36. A thin film transistor layer 40 of semiconductive material is provided over gate dielectric layer 38. For purposes of the continuing discussion, such comprises or defines a source area 41, a channel area 42, a drain area 44, and a drain offset area 43. A buffering etch stop layer 46 is provided outwardly of thin film transistor layer 40. Such preferably comprises $SiO_2$, with an example thickness being 100 Angstroms. Layer 40 at this point in the process is preferably doped with, for example, $BF_2$ to provide a p– desired implant concentration for an offset region to be formed relative to offset area 43. An example p-type implant concentration is $1 \times 10^{17}$–$10^{18}$ ions/cm$^3$.

Figure 8:
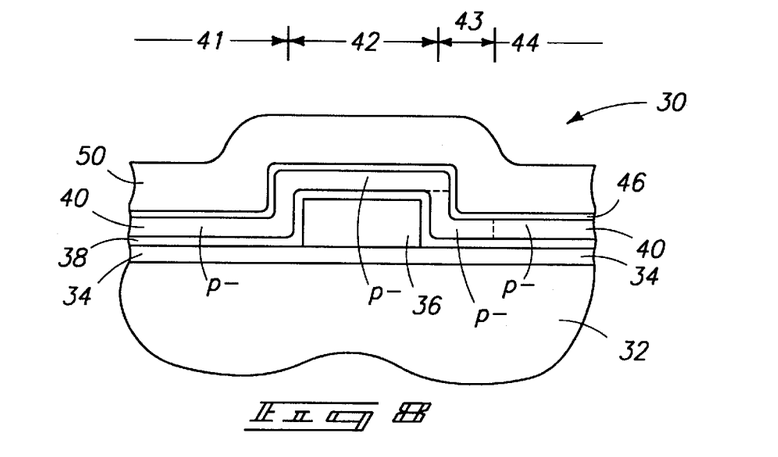
FIG. 8 is a view of the FIG. 7 wafer at a processing step subsequent to that shown by FIG. 7.

Referring to FIG. 8, a masking layer 50 is provided over etch stop layer 46, and thus over thin film transistor layer 40. Masking layer 50 and thin film transistor layer 40 preferably comprise the same predominate material, such as polysilicon. Doping concentration and type however might be different or non-existent, with layers 40 and 50 still essentially comprising the same predominate material. Other materials for layer 50 are also contemplated, such as by way of example only, $Si_3N_4$, $WSi_x$ and $SiO_2$.

Figure 9:
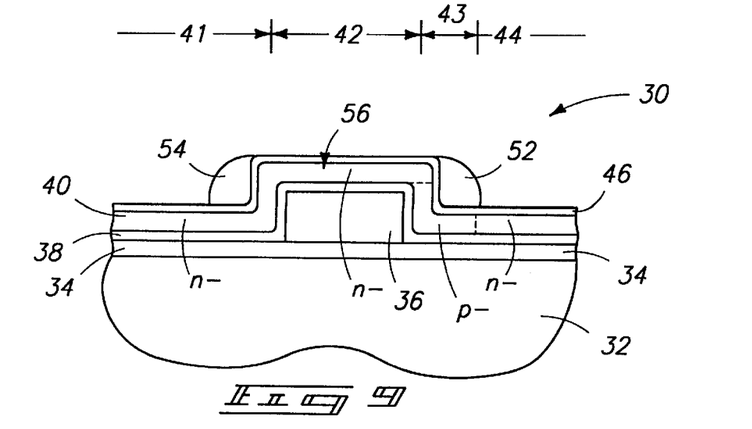
FIG. 9 is a view of the FIG. 7 wafer at a processing step subsequent to that shown by FIG. 8.

Referring to FIG. 9, masking layer 50 is anisotropically etched to define a first masking sidewall spacer 52 laterally adjacent transistor gate 36 over drain offset area 43 and a second masking sidewall spacer 54 laterally adjacent transistor gate 36 over or within source is area 41. Channel area 42 and remaining portions of source area 41 and drain area 44 are left effectively outwardly exposed.

With first and second masking sidewall spacers 52, 54, respectively, in place, a conductivity enhancing impurity of a first type is ion implanted into thin film channel area 42 of thin film transistor layer 40, thus defining a thin film channel region 56. An example and preferred dopant in accordance with the above described example is n-type, such as phosphorus, deposited to a concentration 10 times greater than the p-type implant of FIG. 7, with an example being $1 \times 10^{18}$–$1 \times 10^{19}$ ions/cm$^3$.

Figure 10:
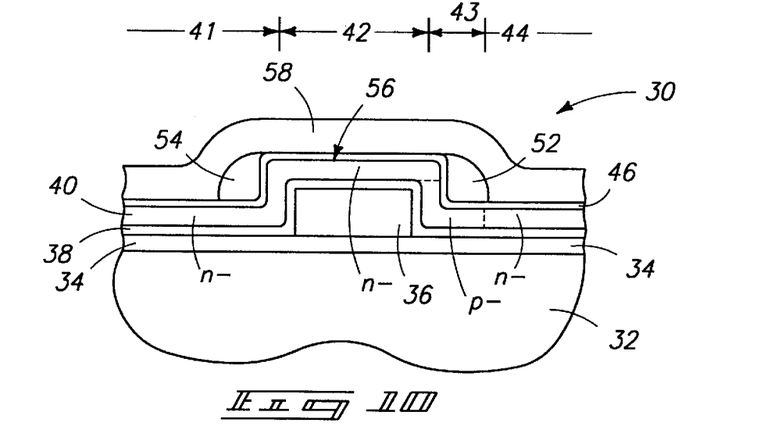
FIG. 10 is a view of the FIG. 7 wafer at a processing step subsequent to that shown by FIG. 9.

Referring to FIG. 10, a fluorine containing layer 58 is provided over first sidewall spacer 52, second sidewall spacer 54, etch stop layer 46, and thereby effectively over polycrystalline thin film layer 40. An example thickness for layer 58 is 500 Angstroms. Wafer fragment 30, having fluorine containing layer 58, is then annealed at a temperature and for a time period which in combination are effective to drive fluorine from fluorine containing layer 58 into polycrystalline thin film layer 40 and incorporate fluorine within grain boundaries in layer 40 to passivate such grain boundaries. Buffering etch stop layer 46 constitutes a buffering layer, with $SiO_2$ deposited to the above preferred thicknesses being effectively transmissive of fluorine ions from layer 58 into regions of thin film transistor layer 40 not covered by first and second masking spacers 52 and 54.

More specifically, layer 58 preferably contains fluorine as an excess of fluorine in the form of free or loosely associated fluorine atoms. An example and preferred material for layer 58 is $WSi_x$ provided by chemical vapor deposition utilizing $WF_6$ and $SiH_4$ as precursors. The fluorine from the $WF_6$ precursor will desirably be appreciably incorporated in layer 58. An example process for providing layer 58 by CVD using $WF_6$ and $SiH_4$ in a manner which maximizes incorporated fluorine includes $WF_6$ and 30 sccm, Ar at 500 sccm, $SiH_4$ at 300 sccm, a temperature of 400° C. and a pressure of 1 Torr. Alternately by way of example only, fluorine containing layer 58 might predominantly comprise elemental W having incorporated fluorine, such as by utilizing a CVD process also using $WF_6$ as a precursor.

The fluorine will incorporated within the grain boundaries from the annealing step will passivate said grain boundaries. The principal mechanism by which such fluorine transports from layer 58 to 40 is understood to be predominantly physical, as opposed to by chemical action. Alternately but less preferred, such fluorine displacement from layer 58 to layer 40 might occur by a chemical mechanism. However most preferably, the annealing temperature and time are selected to be sufficiently great to drive fluorine from layer 58 into polycrystalline layer 40, but also sufficiently low to prevent a chemical reaction of layer 58 with layer 40.

For example where layer 58 predominantly comprises elemental tungsten, an annealing temperature is preferably less than 700° C. to prevent the top or a substantial portion of layer 40 from being reacted with layer 58 to form $WSi_x$. Typical and example preferred annealing temperatures for a $WSi_x$ or other as-deposited layer 58 which has reaction resistance with respect to polycrystalline material of layer 40 is from about 600° C. to 1000° C. for anywhere from 5 seconds (rapid thermal processing) to greater than one hour. The incorporated fluorine within layer 40 preferably forms Si-F bonds with the dangling bonded silicon atoms inherent at the grain boundaries.

Further in accordance with the invention, masking layer 50 can advantageously constitute the fluorine containing layer. A subsequent suitable anneal prior to spacer formation would then preferably be utilized. Layer 58 would not then be utilized.

Figure 11:
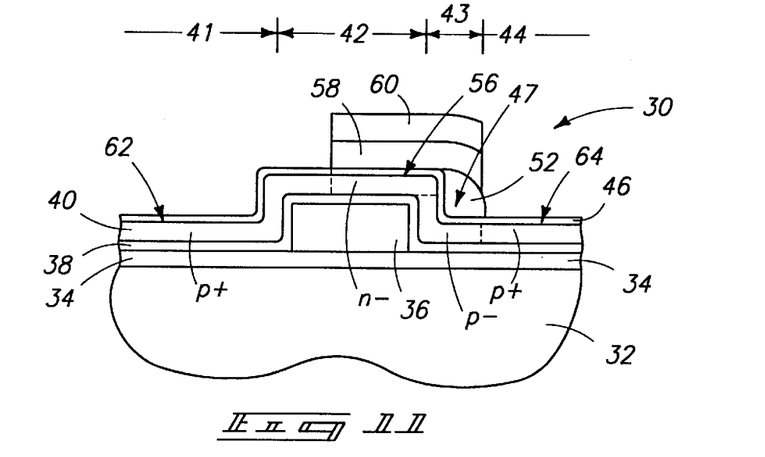
FIGS. 11–12 are views of the FIG. 7 wafer at a processing step subsequent to that shown by FIG. 10.

Referring to FIG. 11, a layer of photoresist 60 is deposited and patterned as shown to mask channel area 42 and drain offset area 43, yet leave source area 41 and drain area 44 outwardly exposed. With patterned photoresist layer 60 in place, fluorine containing layer 58 and second sidewall spacer 54 are etched from outwardly of thin film transistor layer 40. Then with masking layer 60 still in place, ion implanting of a conductivity enhancing impurity of a second type is conducted into thin film source area 41 and thin film drain area 44 to define a thin film source region 62 and a thin film drain region 64 having heavy doping. Such effectively defines an intermediate drain offset region 47. In the described example, the second type would be p-type with, $BF_2$ being an example dopant material. Example resultant concentration in regions 62 and 64 would be greater than or equal to about $1 \times 10^{20}$ ions/cm$^3$. Photoresist layer 60 and fluorine containing layer 58 would thereafter be stripped from the wafer.

The above described example provided drain offset region 47 to be doped with a conductivity enhancing impurity type the same as that of source and drain regions 62 and 64, but to a lower concentration than that of the source and drain regions. Alternately provided drain offset regions are also contemplated. For example, drain offset region 47 might be provided to be doped with a conductivity enhancing impurity the same type as that of channel region 56. Further, such same type impurity might be provided to a lower concentration than that of channel region 56. Further alternatively, drain offset region 47 can be provided to consist essentially of undoped intrinsic semiconductive material of layer 40 as-deposited without doping.

The above described preferred embodiments were with respect to methods of fabricating bottom gated thin film transistor. However fabrication of other thin film transistors is also contemplated, such as top gated thin film transistors and thin film transistors having both bottom and top gates. An example top gated thin film transistor is described with reference to FIG. 12. Like numerals from the FIGS. 7–11 embodiment are utilized where appropriate, with differences being indicated by the suffix "a" or with different numerals. In this example embodiment, component 36a does not necessarily constitute a bottom gate. Such might comprise, for example, an insulating material oxide block, or some electrically conductive device component not necessarily material to the thin film transistor construction or operation. Layer 38a in this example does not necessarily constitute a gate dielectric layer, but is shown to be a thicker layer than the FIGS. 7–11 embodiment to constitute a thicker insulating layer for isolation between a conductive component 36a and the overlying thin film transistor layer.

Figure 12:
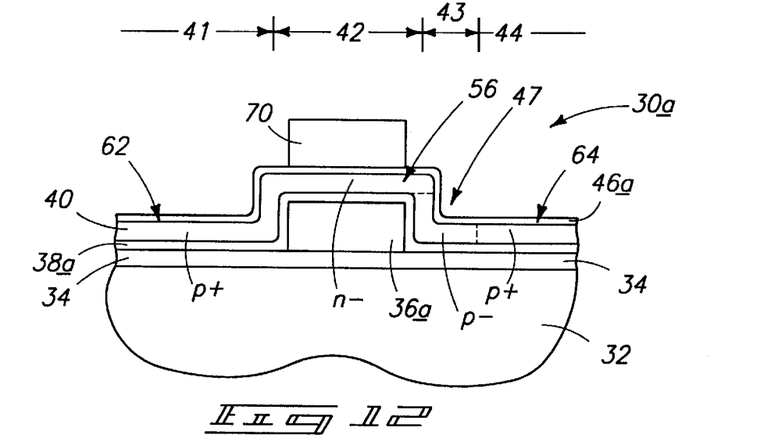

Otherwise in this preferred embodiment, processing occurs as described directly above in the FIGS. 7–11 embodiment, with FIG. 12 depicting processing occurring in sequence after those steps depicted by FIG. 11. Regardless and in accordance with broader aspects of the invention, the illustrated right edge of component 36 or 36a relative to underlying substrate 34 can be considered as an elevation step. Such translates to overlying layers for purposes of facilitating resultant anisotropic etching of a masking layer to define a masking sidewall spacer. Such is inherent in both the FIGS. 7–11 and the FIG. 12 depicted embodiments. In the first described embodiment, the elevation step is provided by the gate of a bottom gated thin film field effect transistor. In the FIG. 12 embodiment, component 36a provides the step.

FIG. 12 also depicts provision of an overlying gate dielectric layer 46a and patterned gate 70 to form a top gated thin film field effect transistor. Gate dielectric layer 46a would typically be a subsequently deposited layer after stripping of etch stop layer 46, where such layer is utilized. Further alternatively, the illustrated component 70 and 36a might both be utilized as gating components for both top and bottom gating the channel region therebetween, with both layers 46a and 38a being utilized as gate dielectric layers in such instance.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a bottom gated thin film transistor comprising the following steps:

providing a transistor gate on a substrate;

providing a thin film transistor layer outwardly of the transistor gate, the thin film transistor layer comprising a source area, a channel area, a drain area, and a drain offset area;

providing a sidewall spacer laterally adjacent the transistor gate over the drain offset area and leaving the channel area outwardly exposed;

with the masking sidewall spacer in place, implanting a conductivity enhancing impurity of a first type into the thin film channel area to provide a thin film channel region; and masking the channel area and the drain offset area while implanting conductivity enhancing impurity of a second type into the thin film source and drain areas to define thin film source and channel regions.

2. A method of forming a thin film transistor comprising the following steps:

providing a substrate having an elevation step;

providing a thin film transistor layer of semiconductive material outward of the substrate with the elevation step; the thin film transistor layer comprising a source area, a channel area, a drain area, and a drain offset area;

providing a spacer laterally adjacent the elevation step over the drain offset area and leaving the channel area outwardly exposed;

with the masking sidewall spacer in place, implanting a conductivity enhancing impurity of a first type into the thin film channel area to provide a thin film channel region;

masking the channel area and the drain offset area while implanting conductivity enhancing impurity of a second type into the thin film source and drain areas to define thin film source and channel regions.

3. A method of forming thin film transistor comprising the following steps:

providing a transistor gate on a substrate;

providing a thin film transistor layer outwardly of the gate dielectric layer; the thin film transistor layer comprising a source area, a channel area, a drain area, and a drain offset area, and wherein the drain offset area is doped with a given conductivity enhancing impurity;

providing a sidewall spacer laterally adjacent the transistor gate over the drain offset area and leaving the channel area outwardly exposed;

with the sidewall spacer in place, implanting a conductivity enhancing impurity of a first type into the thin film channel area to provide a thin film channel region; and masking the channel area and the drain offset area while implanting the conductivity enhancing impurity into the thin film source and drain areas to define thin film source and channel regions.

4. A method of forming a thin film transistor comprising the following steps:

providing a transistor gate outwardly of a substrate;

providing a thin film transistor layer of semiconductive material outwardly of the gate dielectric layer; the thin film transistor layer comprising a source area, a channel area, a drain area, and a drain offset area; and wherein the drain offset area is doped with a conductivity enhancing impurity to a given concentration;

providing a sidewall spacer laterally adjacent the transistor gate over the drain offset area and leaving the channel area outwardly exposed;

with the masking sidewall spacer in place, implanting a conductivity enhancing impurity of a first type into the thin film channel area to provide a thin film channel region; and masking the channel area and the drain offset area while implanting conductivity enhancing impurity of a second type to a given concentration into the thin film source and drain areas to define thin film source and channel regions, and wherein dopant concentration in the drain offset area is lower than the dopant concentration in the source and drain areas.

5. A method of forming a thin film transistor comprising the following steps:

providing a transistor gate on a substrate;

providing a thin film transistor layer of semiconductive material over the gate dielectric layer; the thin film transistor layer comprising a source area, a channel area, a drain area, and a drain offset area; and wherein the drain offset area is doped with a conductivity enhancing impurity to a given concentration;

providing a sidewall spacer laterally adjacent the transistor gate over the drain offset area and leaving the channel area outwardly exposed;

with the masking sidewall spacer in place, implanting a conductivity enhancing impurity of a first type into the thin film channel area to provide a thin film channel region; and masking the channel area and the drain offset area while implanting the conductivity enhancing impurity to a given concentration into the thin film source and drain areas to define thin film source and channel regions, and wherein the dopant concentration in the drain offset area is lower than the dopant concentration in the source and drain area.

6. A method of forming a bottom gated thin film transistor comprising the following steps:

providing a transistor gate over a bulk monocrystalline silicon substrate, the gate projecting outward relative to the substrate;

providing a gate oxide layer over the transistor gate;

providing a thin film transistor layer comprising polysilicon over the gate dielectric layer; the thin film transistor layer comprising a source area, a channel area, a drain area, and a drain offset area;

providing a masking layer over the thin film transistor layer;

anisotropically etching the masking layer to define a masking sidewall spacer laterally adjacent the transistor gate over the drain offset area and leave the channel area outwardly exposed;

with the masking sidewall spacer in place, implanting a conductivity enhancing impurity of a first type into the thin film channel area to provide a thin film channel region; and masking the channel area and the drain offset area while implanting conductivity enhancing impurity of a second type into the thin film source and drain areas to define thin film source and channel regions.

* * * * *

UNITED STATES PATENT AND TRADEMARK OFFICE
CERTIFICATE OF CORRECTION

PATENT NO. : 6,077,732
DATED : June 20, 2000
INVENTOR(S) : Gurtej S. Sandhu, et. al.

It is certified that error appears in the above-identified patent and that said Letters Patent is hereby corrected as shown below:

In column 2, line 33, delete the letter "a".

In column 3, line 51, delete "ii".

In column 4, line 57, delete the word "ad", and insert the word --and--.

In column 5, line 62, delete "$1 \times 10^{17} - 10^{18}$", and insert --$1 \times 10^{17} - 1 \times 10^{18}$--.

Signed and Sealed this

Twenty-second Day of May, 2001

Attest:

NICHOLAS P. GODICI

Attesting Officer    Acting Director of the United States Patent and Trademark Office

UNITED STATES PATENT AND TRADEMARK OFFICE
CERTIFICATE OF CORRECTION

PATENT NO. : 6,077,732
DATED : June 20, 2000
INVENTOR(S) : Gurtej S. Sandhu et al.

It is certified that error appears in the above-identified patent and that said Letters Patent is hereby corrected as shown below:

Column 1,
Line 4, add the following:
-- GOVERNMENT RIGHTS
      This invention was made with the United States Government support under contract No.: MDA972-92-C-0054 awarded by the Advanced Research Projects Agency (ARPA). The United States Government has certain rights in this invention. --

Column 2,
Line 33, delete the letter "a".

Column 3,
Line 51, delete "ii".

Column 4,
Line 57, delete the word "ad", and insert the word -- and --.

Column 5,
Line 62, delete "1 X $10^{17}$ - $10^{18}$", and insert -- 1 X $10^{17}$ - 1 X $10^{18}$ --

Signed and Sealed this

Tenth Day of May, 2005

JON W. DUDAS
*Director of the United States Patent and Trademark Office*